(12) United States Patent
Jacob et al.

(10) Patent No.: US 9,147,616 B1
(45) Date of Patent: Sep. 29, 2015

(54) METHODS OF FORMING ISOLATED FINS FOR A FINFET SEMICONDUCTOR DEVICE WITH ALTERNATIVE CHANNEL MATERIALS

(71) Applicant: GLOBALFOUNDRIES Inc., Grand Cayman (KY)

(72) Inventors: Ajey Poovannummoottil Jacob, Watervliet, NY (US); Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/471,087

(22) Filed: Aug. 28, 2014

(51) Int. Cl.
*H01L 21/84* (2006.01)
*H01L 27/088* (2006.01)
*H01L 29/66* (2006.01)
*H01L 21/8238* (2006.01)

(52) U.S. Cl.
CPC .......... *H01L 21/845* (2013.01); *H01L 27/0886* (2013.01); *H01L 29/66795* (2013.01); *H01L 21/823821* (2013.01); *H01L 29/66545* (2013.01)

(58) Field of Classification Search
CPC .............. H01L 27/0886; H01L 21/845; H01L 21/823821; H01L 29/66795; H01L 29/785; H01L 29/66545
See application file for complete search history.

(56) References Cited

U.S. PATENT DOCUMENTS 7,528,022 B2 * 5/2009 Ahn et al. ............... 438/156

OTHER PUBLICATIONS

Okano et al., "Process Integration Technology and Device Characteristics of CMOS FinFET on Bulk Silicon Substrate with sub-10 nm Fin Width and 20 nm Gate Length," 2005 IEEE.

* cited by examiner

*Primary Examiner* — David Vu
(74) *Attorney, Agent, or Firm* — Amerson Law Firm, PLLC

(57) ABSTRACT

One illustrative method disclosed herein includes, among other things, oxidizing a lower portion of an initial fin structure to thereby define an isolation region that vertically separates an upper portion of the initial fin structure from a semiconducting substrate, performing a recess etching process to remove a portion of the upper portion of the initial fin structure so as to define a recessed fin portion, forming a replacement fin on the recessed fin portion so as to define a final fin structure comprised of the replacement fin and the recessed fin portion, and forming a gate structure around at least a portion of the replacement fin.

14 Claims, 9 Drawing Sheets

METHODS OF FORMING ISOLATED FINS FOR A FINFET SEMICONDUCTOR DEVICE WITH ALTERNATIVE CHANNEL MATERIALS

BACKGROUND OF THE INVENTION

1. Field of the Invention

Generally, the present disclosure relates to the manufacture of FET semiconductor devices, and, more specifically, to various methods of forming isolated fins for a FinFET semiconductor device with alternative channel materials.

2. Description of the Related Art

The fabrication of advanced integrated circuits, such as CPU's, storage devices, ASIC's (application specific integrated circuits) and the like, requires the formation of a large number of so-called metal oxide field effect transistors (MOSFETs or FETs). A transistor includes a source region, a drain region, a channel region that is positioned between the source region and the drain region, and a gate electrode positioned above the channel region that is separated therefrom by a gate insulation layer. Current flow between the source and drain regions of the FET device is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the channel length of FETs over the past decades, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded. Additionally, decreasing the channel length may lead to an undesirable increase in so-called off-state leakage currents, i.e., the amount of current that flows through the transistor when it is turned "OFF."

Transistors come in a variety of configurations. A conventional FET is a planar device, wherein the transistor is formed in and above an active region having a substantially planar upper surface. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10.

Unlike a planar FET, in a FinFET device, a channel is formed perpendicular to a surface of the semiconducting substrate so as to increase the drive current per footprint of the device. Also, in a FinFET device, the improved gate control through multiple gates on a narrow, fully-depleted semiconductor fin significantly reduces undesirable short channel effects. When an appropriate voltage is applied to the gate electrode 16 of a FinFET device 10, the surfaces (and the inner portion near the surface) of the fins 14, i.e., the vertically oriented sidewalls and the top upper surface of the fin (for a tri-gate device), form a surface inversion layer or a volume inversion layer that contributes to current conduction. Accordingly, for a given plot space (or foot-print), FinFETs tend to be able to generate significantly higher drive current than planar transistor devices. Additionally, FinFET devices exhibit less off-state leakage currents as compared to planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. As noted above, device designers are currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed.

However, the integration of such alternative materials on silicon substrates (the dominant substrates used in the industry) is non-trivial due to, among other issues, the large difference in lattice constants between such alternative materials and silicon. That is, with reference to FIG. 1, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles corresponding to the (111) plane.

However, FinFET devices still exhibit some performance-limiting characteristics. As noted above, one such characteristic that is detrimental to all forms of semiconductor devices, both FinFETs and planar FETs, is off-state leakage currents. Ideally, off-state leakage current is minimized to increase device performance. In the case of a bulk FinFET device, it has been noted that the so-called "punch through leakage current" densities vary along the vertical height of the fins, with the current densities being much greater at the bottom of the fins proximate the local isolation regions of the device. See, e.g., Okano et al., "Process Integration Technology and Device Characteristics of CMOS FinFET on Bulk Silicon Substrate with sub-10 nm Fin Width and 20 nm Gate Length," IEDM Technical Digest, pp. 721-724, 2005. Efforts have been made in the past in attempts to reduce such punch through leakage currents in FinFET devices.

FIGS. 2A-2F depict one illustrative prior art method of forming isolated fins for a FinFET semiconductor device in an attempt to reduce or eliminate such off-state leakage currents. FIG. 2A depicts the device at a point in fabrication after one or more etching processes were performed through a patterned etch mask (not shown) to define a plurality of initial trenches 13 in the substrate 12. The formation of the trenches 12 results in the formation of a fin structure 14 comprised of the substrate material. The width and height of the fin structure 14 as well as the depth of the trenches 13 may vary depending upon the particular application. FIG. 2B depicts the device after a sacrificial liner layer 22 (e.g., silicon nitride) was formed on the exposed portions of the fin 14. FIG. 2C depicts the device after another anisotropic etching process was performed to extend the initial depth of the initial trenches 13 in the substrate 12. This second etching process results in a plurality of second trenches 24. Next, as shown in FIG. 2D, the trenches 24 were overfilled with an insulating material 26, e.g., silicon dioxide, an oxygen-rich silicon dioxide, etc., or multiple layers thereof, etc. FIG. 2E depicts the device after a thermal anneal process 28 was performed on the device. The thermal anneal process 28 was performed under conditions such that substantially all of portions of the fin 14 not covered by the sacrificial layer 22 are oxidized, i.e., converted into an insulating material, e.g., silicon dioxide, as indicated within the dashed-line region 30. FIG. 2F depicts the device after a recess etching process was performed to recess the layer of insulating material 26 to a desired height such that the desired amount of the fin 14 is exposed above the surface of the layer of insulating material 26. Thereafter, one or more etching processes were performed to remove the sacrificial liner layer 22. At this point in the process flow, the final fin structure 14 has been exposed to its final desired fin height and isolation material is positioned laterally under the entire width of the final fin structure 14. At this point, traditional manufacturing operations may be performed to complete the fabrication of the illustrative FinFET device, e.g., gate formation, etc.

Several other prior art techniques have been employed in an attempt to reduce offstate leakage currents. These include, but are not limited to, (1) directly undercutting the fin and backfilling the undercut area with an insulating material; (2) forming a sacrificial fin structure, forming a layer of insulating material adjacent the sacrificial fin structure, forming final fin structures on the sidewalls of the sacrificial fin structure and on top of the layer of insulating material and removing the sacrificial fin structure; (3) forming a patterned layer of insulating material on a substrate, growing an epi material above the layer of insulating material by growing epi on the exposed portions of the substrate and patterning the fins from the epi material that is positioned above the layer of insulating material; and (4) formation of epi material on a single crystal insulating material (e.g., a rare earth oxide) and thereafter patterning the epi material to define the fins. All of these methods present significant challenges when it comes to forming FinFET devices with alternative channel materials. What is needed is an efficient and cost-effective method of forming alternative channel materials on FinFET devices that reduces or eliminates the above-described "punch through leakage currents" in such devices.

The present disclosure is directed to various methods of forming isolated fins for a FinFET semiconductor device with alternative channel materials that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolated fins for a FinFET semiconductor device with alternative channel materials. One illustrative method disclosed herein includes, among other things, forming an initial fin structure in a semiconducting substrate, oxidizing a lower portion of the initial fin structure to thereby define an isolation region that vertically separates an upper portion of the initial fin structure from the semiconducting substrate, performing a recess etching process to remove a portion of the upper portion of the initial fin structure so as to define a recessed fin portion, forming a replacement fin on the recessed fin portion so as to define a final fin structure comprised of the replacement fin and the recessed fin portion, and forming a gate structure around at least a portion of the replacement fin.

Another illustrative method disclosed herein involves, among other things, forming an initial fin structure in a semiconducting substrate, oxidizing a lower portion of the initial fin structure to thereby define an isolation region that vertically separates an upper portion of the initial fin structure from the semiconducting substrate, performing a recess etching process to remove a portion of the upper portion of the initial fin structure positioned between sacrificial sidewall spacers formed adjacent the upper portion of the initial fin structure so as to define a recessed fin portion and to define a replacement gate cavity between the sacrificial sidewall spacers above the recessed fin portion, forming a replacement fin in the replacement fin cavity above the recessed fin portion so as to define a final fin structure comprised of the replacement fin and the recessed fin portion, removing the sacrificial sidewall spacers, and forming a gate structure around at least a portion of the replacement fin.

Yet another illustrative method disclosed herein includes forming a plurality of initial trenches that extend into a semiconducting substrate to an initial depth so as to thereby define an initial fin structure comprised of the substrate material, forming sacrificial sidewall spacers adjacent the sidewalls of the initial fin structure, after forming the sacrificial sidewall spacers, extending the initial depth of the initial trenches into the substrate and thereby define an elongated fin structure having an exposed portion that is not covered by the sacrificial sidewall spacers, forming a layer of insulating material so as to over-fill the extended depth trenches and, with the layer of insulating material in position, performing a thermal anneal process to convert at least a portion of the exposed portion of the elongated fin structure into an isolation material that extends laterally under an entire width of an upper portion of the elongated fin structure. In this embodiment, the method further comprises performing at least one process operation to expose an upper surface of the upper portion of the elongated fin structure, performing a recess etching process to remove a portion of the upper portion of the elongated fin structure positioned between the sacrificial sidewall spacers so as to define a recessed fin portion and to define a replacement gate cavity between the sacrificial sidewall spacers above the recessed fin portion, forming a replacement fin in the replacement fin cavity above the recessed fin portion so as to define a final fin structure comprised of the replacement fin and the recessed fin portion, recessing the layer of insulating material so as to expose the sacrificial sidewall spacers, removing the sacrificial sidewall spacers, and forming a gate structure around at least a portion of the replacement fin.

One illustrative FinFET device disclosed herein includes, among other things, a semiconducting substrate, a fin structure vertically separated from the substrate, the fin structure comprising an upper fin portion and a bottom fin portion, wherein the bottom fin portion is comprised of the substrate material and the upper fin portion is comprised of a semiconducting material that is different than the substrate material, an isolation region positioned below the bottom fin portion that vertically separates the fin structure from the semiconducting substrate, and a gate structure around at least a portion of the upper fin portion.

BRIEF DESCRIPTION OF THE DRAWINGS

The disclosure may be understood by reference to the following description taken in conjunction with the accompanying drawings, in which like reference numerals identify like elements, and in which.

Figure 1:
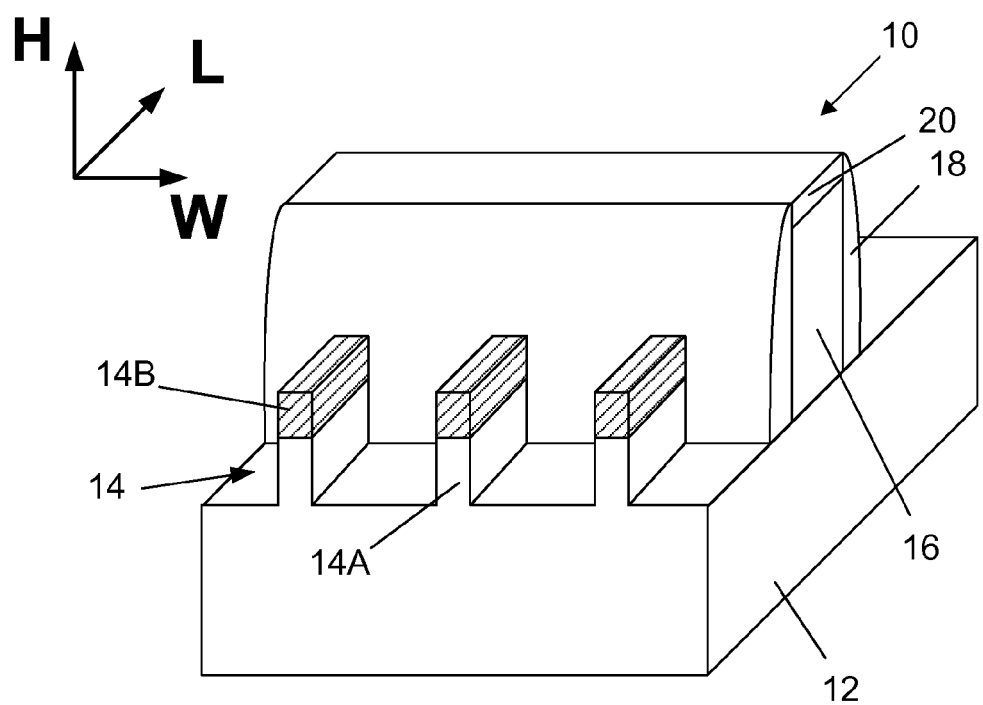
FIG. 1 depicts an illustrative example of a FinFET device with various features identified for reference purposes.
Figure 2A:
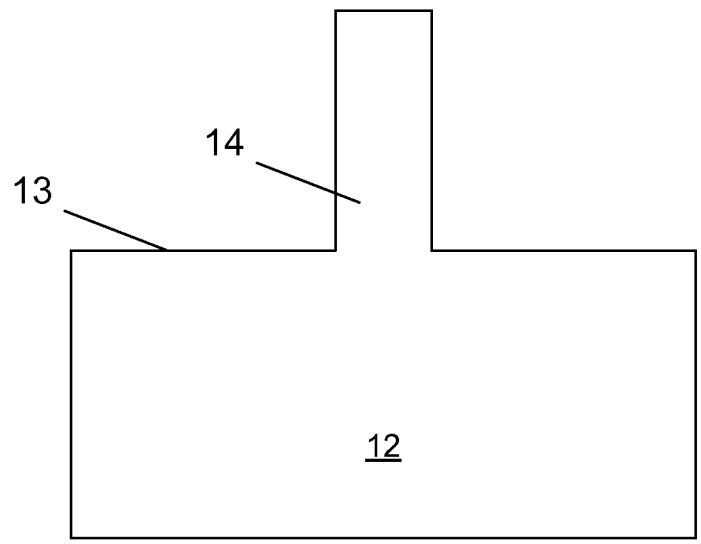
FIGS. 2A-2F depict one illustrative prior art method of forming isolated fins for a FinFET semiconductor device.
Figure 2B:
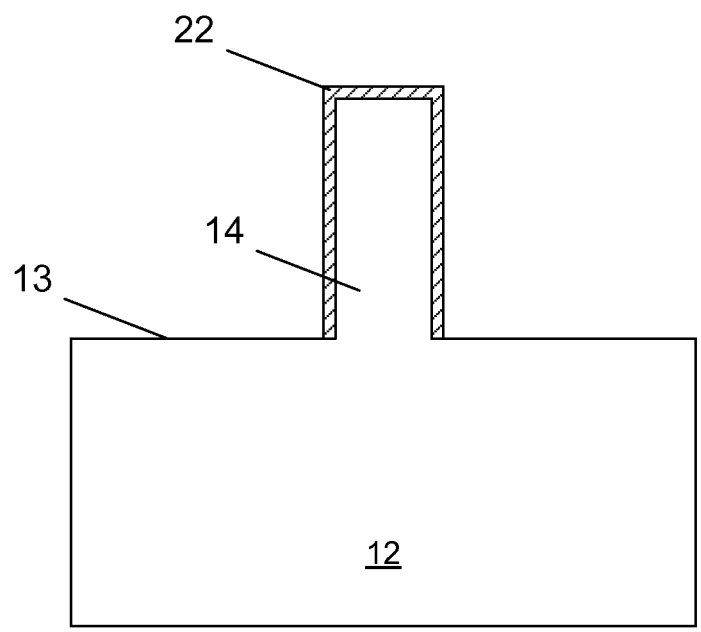
Figure 2C:
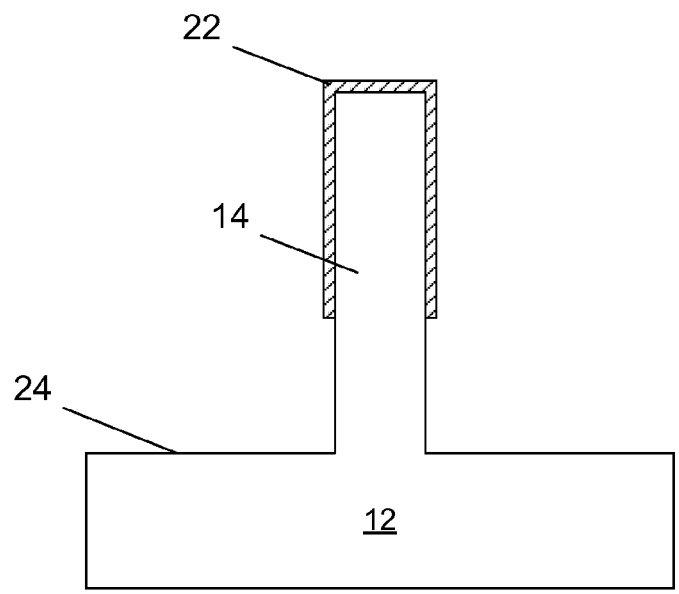
Figure 2D:
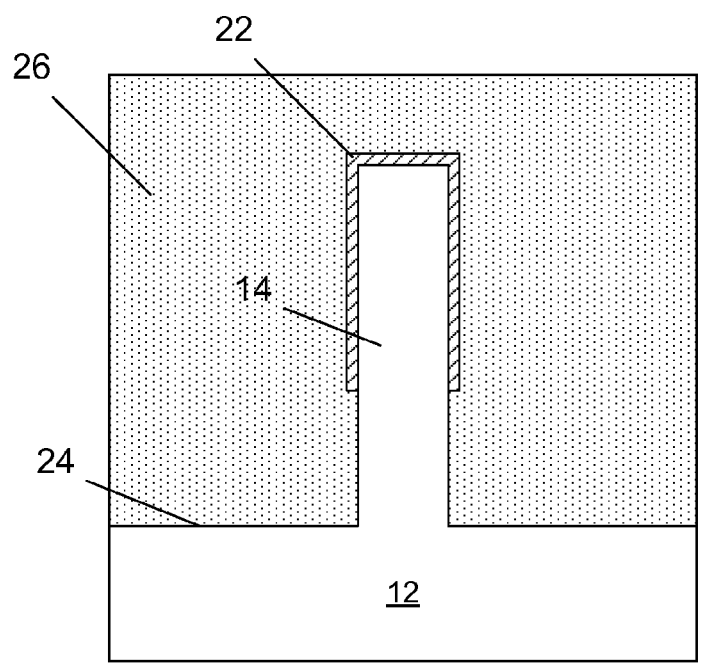
Figure 2E:
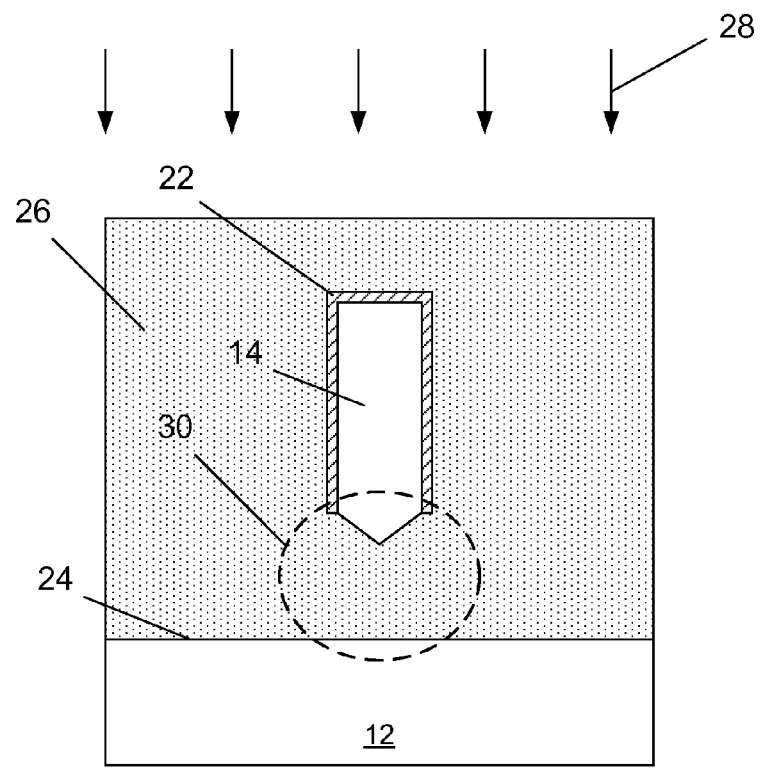
Figure 2F:
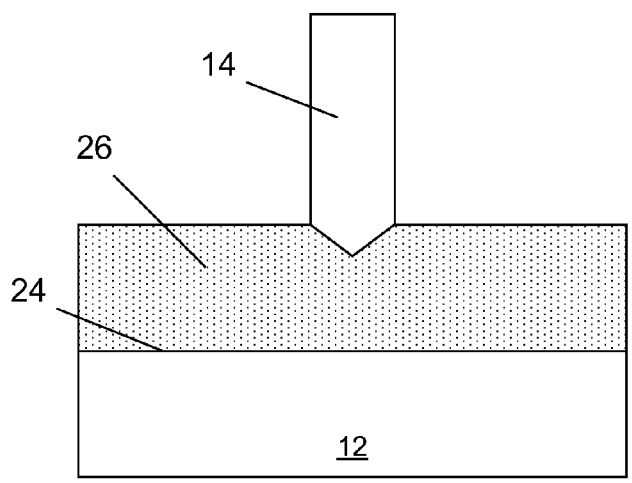

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolated fins for a FinFET semiconductor device with alternative channel materials. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 3A:
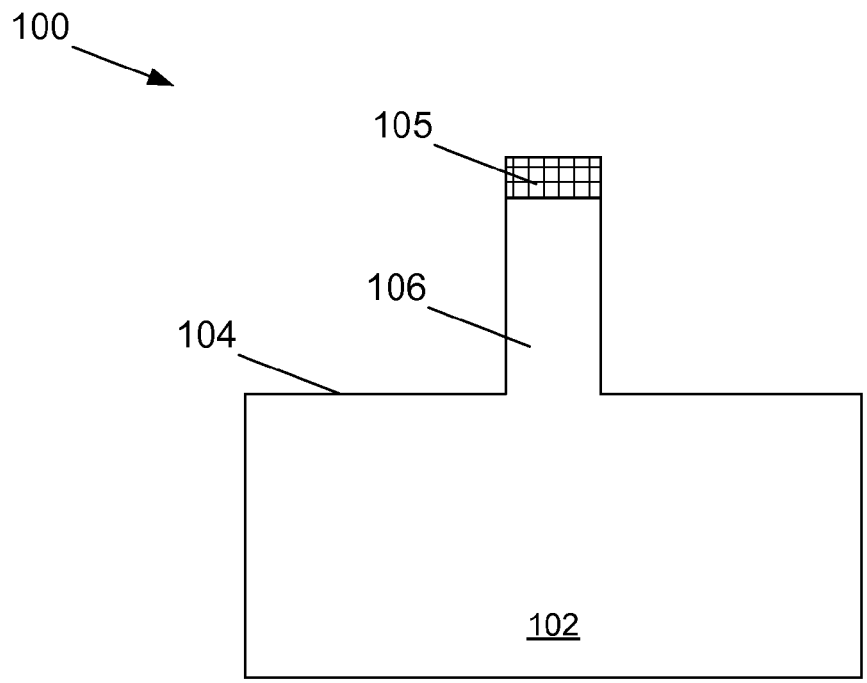
FIGS. 3A-3J depict various illustrative methods disclosed herein of forming isolated fins for a FinFET semiconductor device with alternative channel materials.

FIG. 3A is a perspective view of an illustrative FinFET semiconductor device 100 that may be formed in accordance with the methods disclosed herein. The device 100 is formed in and above a semiconductor substrate 102. The illustrative substrate 102 may be a bulk semiconductor substrate. Thus, the terms "substrate," "semiconductor substrate" or "semiconducting substrate" should be understood to cover all semiconductor materials and all forms of such semiconductor materials. In some embodiments, the substrate may be wafers with the (100) planes located substantially along the sidewalls and/or upper surface of the fin to achieve more uniform growth of epi material, as described below.

The device 100 depicted in FIGS. 3A-3J will be depicted as only having a single fin. Of course, using the methods disclosed herein, a FinFET device may be formed with any desired number of fins. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 3A depicts the device 100 at a point in fabrication after one or more etching processes were performed through a patterned etch mask 105, such as a patterned layer of photoresist material or a patterned hard mask layer, to define a plurality of initial trenches 104 in the substrate 102. The formation of the trenches 104 results in the formation of an initial fin structure 106 comprised of a portion of the substrate 102. The width and height of the fin structure 106 as well, as the depth of the trenches 104, may vary depending upon the particular application. In one illustrative example, the height of the initial fin structure 106 at this point in the process flow may be about 20-60 nm.

The overall size, shape and configuration of the fin-formation trenches 104 and fins 106 may vary depending on the particular application. In the illustrative examples depicted in the attached drawings, the fin-formation trenches 104 and fins 106 are all depicted as having a uniform size and shape. However, such uniformity in the size and shape of the fin-formation trenches 104 and the fins 106 is not required to practice at least some aspects of the inventions disclosed herein. In the attached figures, the fin-formation trenches 104 are depicted as having been formed by performing an anisotropic etching process that results in the fin-formation trenches 104 having a schematically depicted, generally rectangular configuration. In an actual real-world device, the sidewalls of the fin-formation trenches 104 may be somewhat inwardly tapered, although that configuration is not depicted in the attached drawings. Thus, the size and configuration of the fin-formation trenches 104, and the manner in which they are made, as well as the general configuration of the fins 106, should not be considered a limitation of the present invention. For ease of disclosure, only the substantially rectangular fin-formation trenches 104 and fins 106 will be depicted in the subsequent drawings.

Figure 3B:
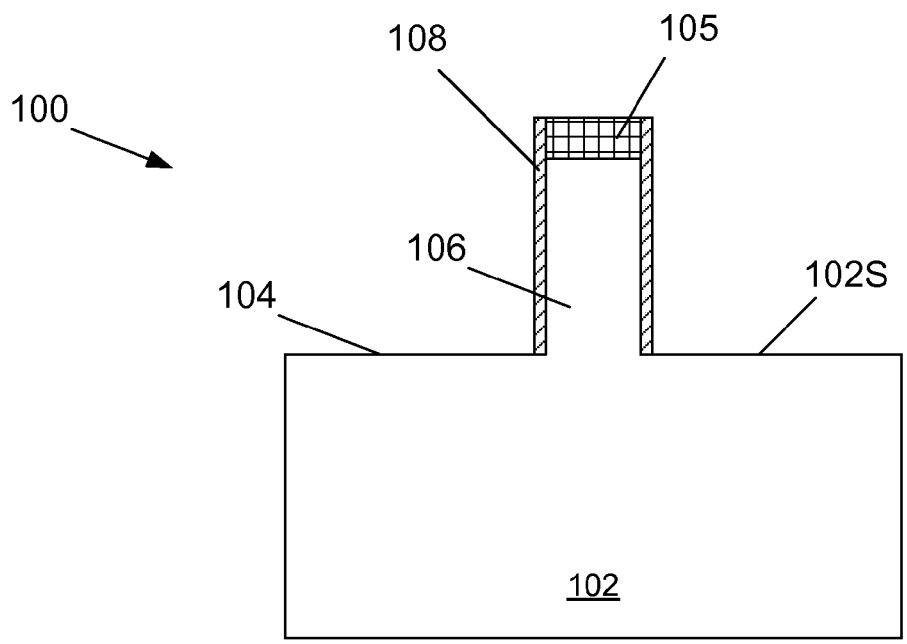

FIG. 3B depicts the device 100 after sacrificial sidewall spacers 108 were formed adjacent the fin structure 106. The spacers 108 may be formed by conformably depositing a layer of spacer material and thereafter performing an anisotropic etching process. The anisotropic etching process essentially clears the sacrificial material from the surface 102S of the substrate 102 in the trenches 104. In one embodiment, the sacrificial sidewall spacers 108 may be made of silicon nitride, and they may have a thickness of about 15-20 nm. As will be appreciated by those skilled in the art after a complete reading of the present application, the sidewall spacers 108 are formed to protect the initial fin structure 106 during subsequent processing operations, as will be described more fully below.

Figure 3C:
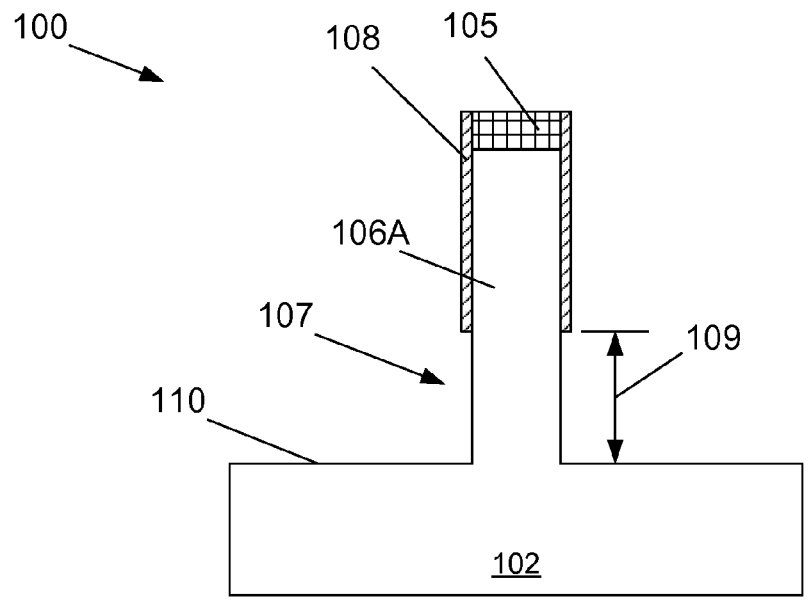

FIG. 3C depicts the device 100 after one or more second etching processes, e.g., anisotropic etching processes, were performed to extend the initial depth of the initial trenches 104 in the substrate 102 to a greater second depth. This second etching process results in a plurality of second or final trenches 110 and the formation of an elongated fin structure 106A. The depth of the second or final trenches 110 may vary depending upon the particular application. In one illustrative example, the height 109 of the exposed portion 107 of the elongated fin structure 106A may fall within the range of about 10-200 nm.

Figure 3D:
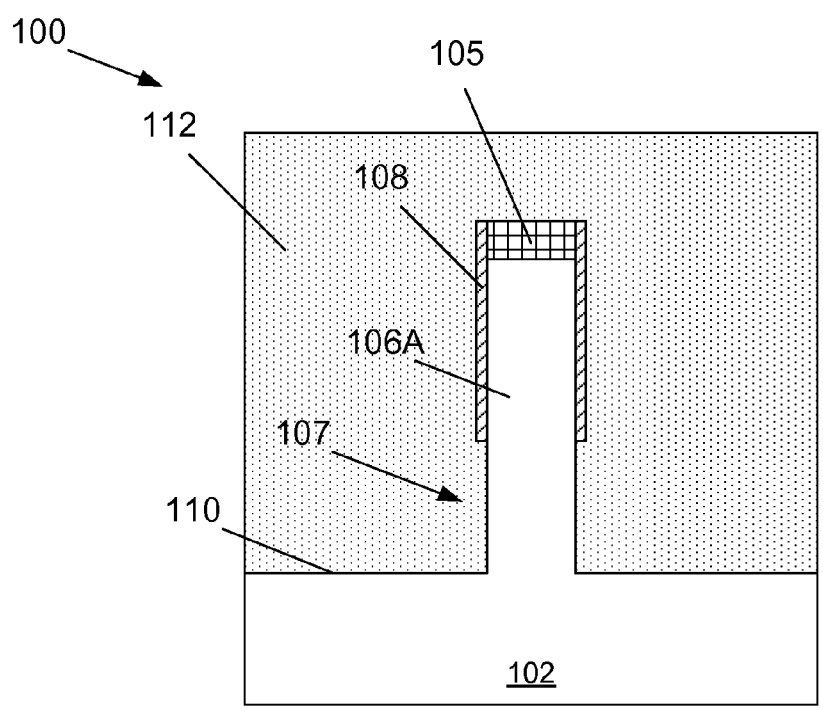

Thereafter, as shown in FIG. 3D, the final trenches 110 were overfilled with an insulating material 112. The layer of insulating material 112 discussed herein may be comprised of a variety of different materials, such as, for example, silicon dioxide, an oxygen-rich silicon dioxide, etc., or multiple layers thereof, etc., and it may be formed by performing a variety of techniques, e.g., chemical vapor deposition (CVD), etc.

Figure 3E:
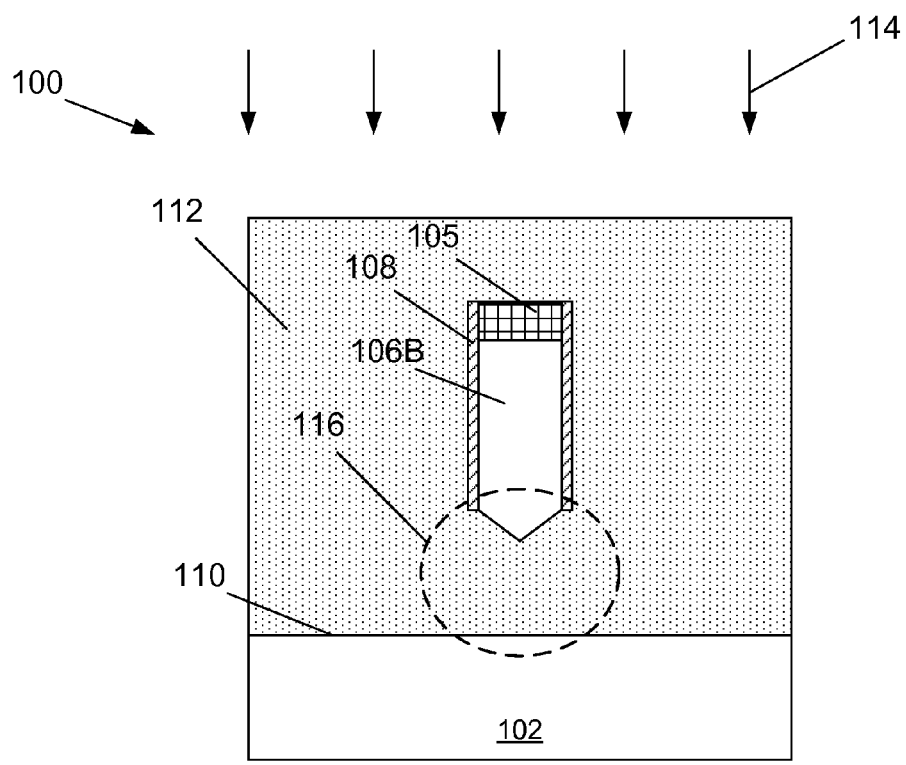

FIG. 3E depicts the device 100 after a thermal anneal process 114 was performed on the device 100. In general, the thermal anneal process 114 is performed under conditions such that substantially all of exposed portion 107 (FIG. 3D) of the elongated fin structure 106A (FIG. 3D) is converted into an insulating material, as indicated within the dashed region 116, e.g., an isolation region comprised of silicon dioxide. That is, the thermal anneal process 114 is performed under conditions such that isolation material is formed under the entire lateral width of the remaining fin structure, such that an upper portion 106B of the elongated fin structure 106A is vertically spaced apart from the substrate 102 with the isolation region 116 separating the two structures. The downward-facing faceted end on the bottom of the upper portion 106B is due to the crystallographic orientation of the substrate 102. The parameters of the thermal anneal process may vary depending upon the particular application. In one illustrative embodiment, the thermal anneal process 114 may be performed at a temperature that falls within the range of about 400-1200° C. for a duration in an oxidizing processing ambient (wet or dry). In some cases, the thermal anneal process 114 may be performed in an open-air furnace. The thermal anneal process 114 may be performed using an RTA furnace, a laser anneal process or a traditional furnace, depending upon the particular application. The duration of the thermal anneal process 114 may vary depending upon a variety of factors, e.g., it may range from nanoseconds to hours depending upon the particular processing tools and techniques used to perform the anneal process 114, such as an RTA chamber or a traditional furnace. Additionally, the rate of oxidation may be controlled or "tuned" by controlling the thickness of the layer of insulating material 112. It is anticipated that, in all cases, the layer of insulating material 112 will be deposited such that its upper surface is positioned above the upper surface of the masking layer 105 and that the thermal anneal process 114 will be performed with the final trenches 110 in such an overfilled condition. In general, the layer of insulating material 112 should be deposited such that its upper surface is positioned approximately level with to a few hundred nanometers above the upper surface of the masking layer 105, depending upon downstream planarization and the oxide recess scheme. However, to control the rate of oxidation, the layer of insulating material 112 may be deposited to an even greater thickness to reduce the rate of oxidation of the exposed portion 107 of the elongated fin structure 106A.

Figure 3F:
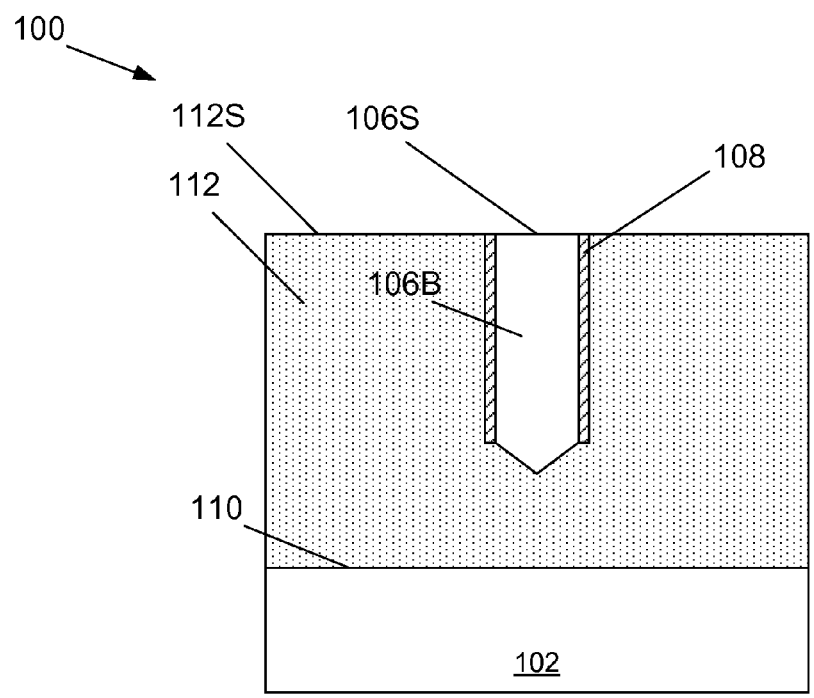

FIG. 3F depicts the device 100 after one or more chemical mechanical polishing (CMP) processes were performed on the layer of insulating material 112 to planarize its upper surface 112S with the upper surface 106S of the upper portion 106B. This process operation removes the patterned mask layer 105.

Figure 3G:
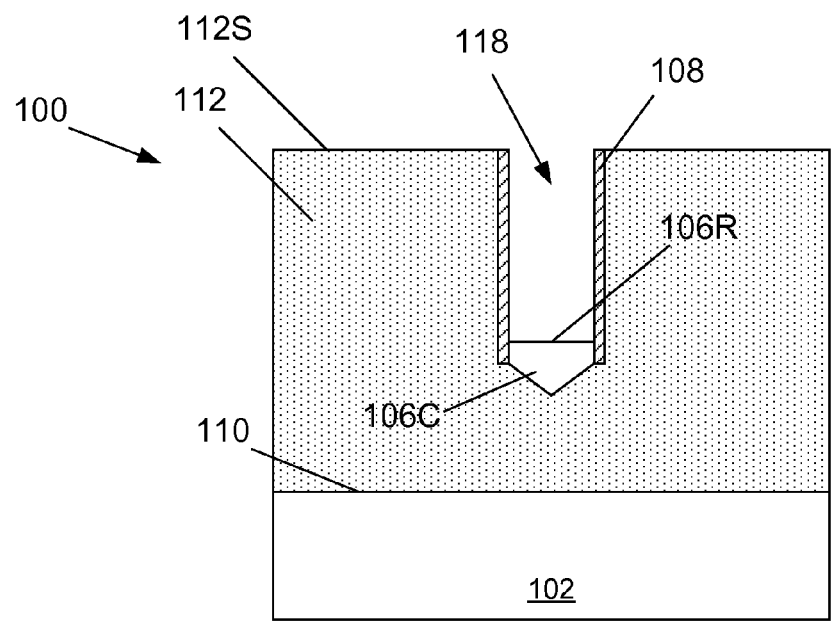

FIG. 3G depicts the device 100 after a recess etching process was performed on the upper portion 106B (FIG. 3F) to thereby define a recessed fin portion 106C having an upper surface 106R. The amount or extent of recessing of the upper portion 106B may vary depending upon the particular application. The recessing process results in the formation of a replacement fin cavity 118 above the recessed fin portion 106C. In one illustrative embodiment, the replacement fin cavity 118 may have a depth that falls within the range of about 5-60 nm.

Figure 3H:
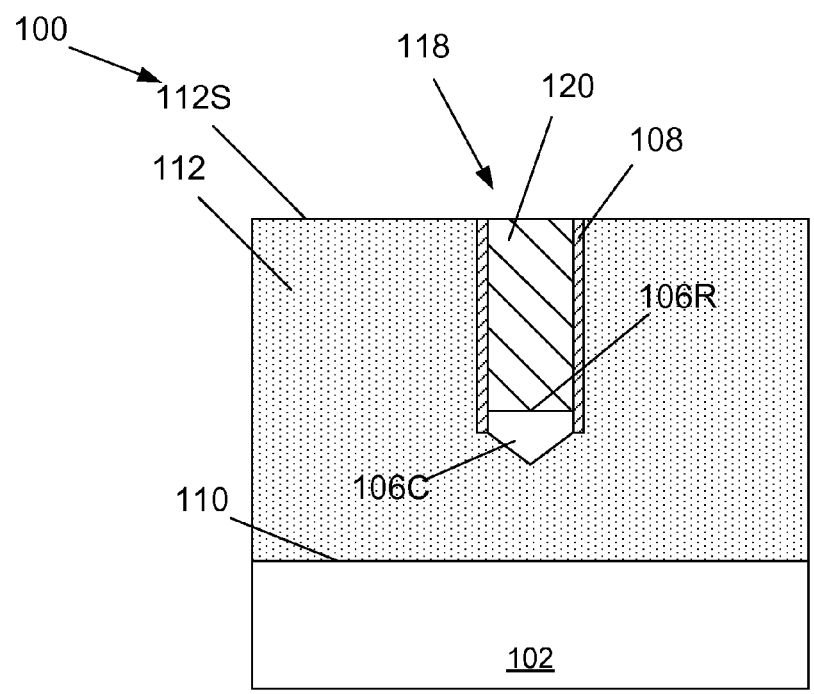

FIG. 3H depicts the device 100 after a replacement fin 120 has been formed in the fin cavity 118 on the recessed fin portion 106C. The replacement fin 120 may be formed by performing an epitaxial growth process using the crystalline structure of the recessed fin portion 106C as the starting material. In one embodiment, the epitaxial deposition process may be controlled such that the replacement fin 120 does not form outside of the fin cavity 118. In other cases, the epitaxial deposition process may be performed such that the epi material overfills the replacement fin cavity 118. In such a situation, a CMP process may be performed to remove the excess portions of the epi material so as to arrive at the structure depicted in FIG. 3H. The replacement fin 120 is comprised of a semiconductor material that is different than the semiconductor material of the recessed fin portion 106C (which is comprised of the material of the substrate 102). In general, the replacement fin 120 may be comprised of a variety of different materials, e.g., substantially pure germanium, silicon-germanium ($Si_{(1-x)}Ge_{(x)}$, where "x" ranges from 0-1), a III-V material, a combination of III-V materials, etc. The epi material for the replacement fin 120 may also be doped with any additional material if desired, e.g., carbon, boron, an N-type dopant, a P-type dopant, etc. Such dopant material may be added by way of in situ doping or by ion implantation. Collectively, the replacement fin 120 and the recessed fin portion 106C define a final fin structure 125 (FIG. 3I) for the device 100.

Figure 3I:
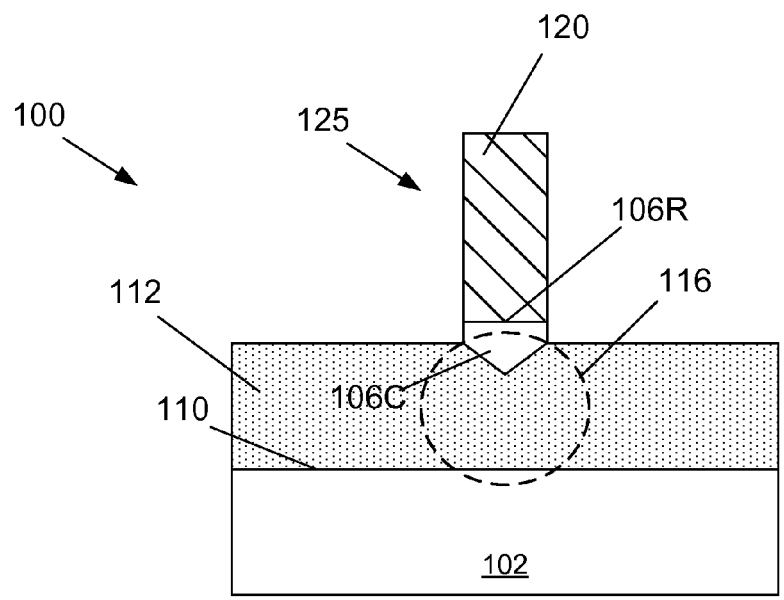

FIG. 3I depicts the device 100 after several process operations were performed. First, an etching process was performed to recess the layer of insulating material 112 to a desired height such that the desired amount of the replacement fin structure 120 is exposed above the recessed surface of the layer of insulating material 112. Thereafter, one or more etching processes were performed to remove the sidewall spacers 108. At this point in the process flow, at least a portion of the replacement fin structure 120 has been exposed to its final desired fin height and isolation material 116 is positioned laterally under the entire width of the final fin structure 125 (in the gate width direction of the device as depicted in FIG. 3I) as well as under the entire axial length of the final fin structure 125 (in the gate length direction of the device).

Figure 3J:
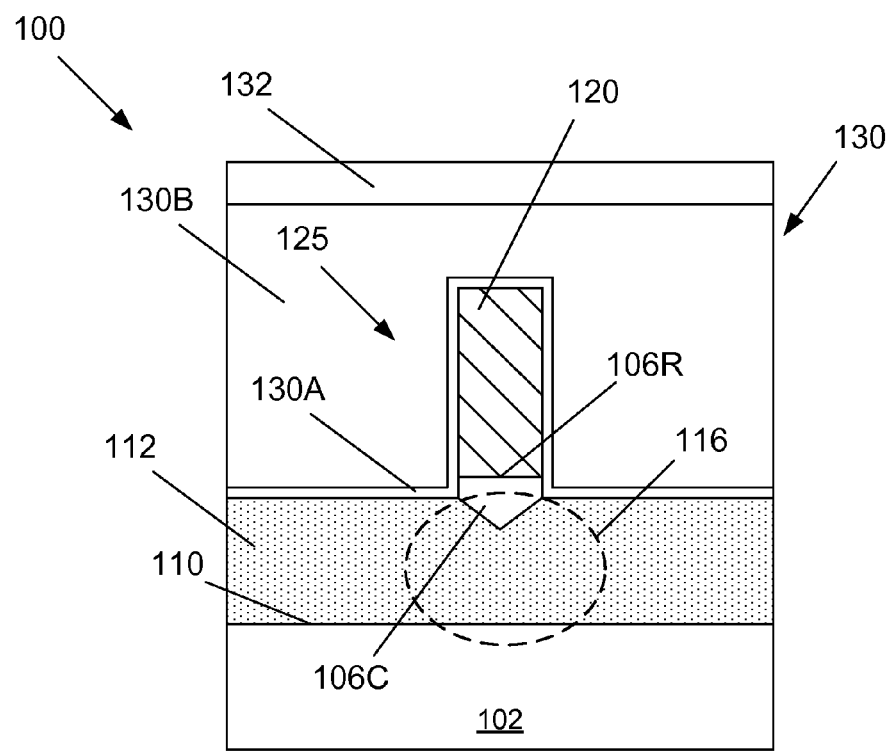

FIG. 3J depicts the device 100 after an illustrative and schematically depicted gate structure 130 and gate cap layer 132 are formed around the channel region of the device 100 using well-known techniques. In one illustrative embodiment, the schematically depicted gate structure 130 includes an illustrative gate insulation layer 130A and an illustrative gate electrode 130B. The gate structure 130 may be formed using so-called gate-first or replacement gate techniques. The gate insulation layer 130A may be comprised of a variety of different materials, such as, for example, a so-called high-k (k value greater than 10) insulation material (where k is the relative dielectric constant), etc. Similarly, the gate electrode 130B of the gate structure 130 may be comprised of polysilicon or one or more metal layers that act as the gate electrode. As will be recognized by those skilled in the art after a complete reading of the present application, the gate structure 130 of the device 100 depicted in the drawings, i.e., the gate insulation layer and the gate electrode, is intended to be representative in nature. That is, the gate structure 130 may be comprised of a variety of different materials and it may have a variety of configurations.

At the point of fabrication depicted in FIG. 3J, traditional manufacturing techniques may be performed to complete the manufacture of the device 100. For example, additional contacts and metallization layers may be formed above the device 100 using traditional techniques.

As will be appreciated by those skilled in the art after a complete reading of the present application, there are several novel methods and devices disclosed herein. In the appended claims, the term "initial fin structure" may be used to describe the fin structure 106 at the point of fabrication depicted in FIG. 3A, or it may refer to the elongated fin structure 106A, as shown in FIG. 3C. The context of the particular claim language will make it clear which structure is being referred to in the claim.

One illustrative method disclosed herein includes, among other things, forming an initial fin structure 106A in a semiconducting substrate 102, oxidizing a lower portion 107 of the initial fin structure 106A to thereby define an isolation region 116 that vertically separates an upper portion 106B of the initial fin structure 106A from the semiconducting substrate, performing a recess etching process to remove a portion of the upper portion 106B of the initial fin structure so as to define a recessed fin portion 106C, forming a replacement fin 120 on the recessed fin portion 106B so as to define a final fin structure 125 comprised of the replacement fin 120 and the recessed fin portion 106C, and forming a gate structure 130 around at least a portion of the replacement fin 120.

Another illustrative method disclosed herein includes forming a plurality of initial trenches 104 that extend into a semiconducting substrate 102 to an initial depth so as to thereby define an initial fin structure 106 comprised of the substrate material, forming sacrificial sidewall spacers 108 adjacent the sidewalls of the initial fin structure 106, after forming the sacrificial sidewall spacers 108, extending the initial depth of the initial trenches 104 into the substrate and thereby define an elongated fin structure 106A having an exposed portion 107 that is not covered by the sacrificial sidewall spacers 108, forming a layer of insulating material 112 so as to over-fill the extended depth trenches 110 and, with the layer of insulating material 112 in position, performing a thermal anneal process 114 to convert at least a portion of the exposed portion 107 of the elongated fin structure 106A into an isolation material that extends laterally under an entire width of an upper portion 106B of the elongated fin structure 106A. In this embodiment, the method further comprises performing at least one process operation to expose an upper surface of the upper portion 106B of the elongated fin structure 106A, performing a recess etching process to remove a portion of the upper portion 106B of the elongated fin structure 106A positioned between the sacrificial sidewall spacers 108 so as to define a recessed fin portion 106C and to define a replacement gate cavity 118 between the sacrificial sidewall spacers 108 above the recessed fin portion 106C, forming a replacement fin 120 in the replacement fin cavity 118 above the recessed fin portion 106C so as to define a final fin structure 125 comprised of the replacement fin 120 and the recessed fin portion 106C, recessing the layer of insulating material 112 so as to expose the sacrificial sidewall spacers 108, removing the sacrificial sidewall spacers 108, and forming a gate structure 130 around at least a portion of the replacement fin 120.

One illustrative FinFET device disclosed herein includes, among other things, a semiconducting substrate 102, a fin structure 125 vertically separated from the substrate 102, the fin structure 125 comprising an upper fin portion 120 and a bottom fin portion 106C, wherein the bottom fin portion 106C is comprised of the substrate material and the upper fin portion 120 is comprised of a semiconducting material that is different than the substrate material, an isolation region 116 positioned below the bottom fin portion 106C that vertically separates the fin structure 125 from the semiconducting substrate 102, and a gate structure 130 around at least a portion of the upper fin portion 120.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim lan-

What is claimed:

1. A method of forming a FinFET device, comprising:
forming an initial fin structure in a semiconducting substrate, wherein said initial fin structure is comprised of the substrate material;
oxidizing a lower portion of said initial fin structure to thereby define an isolation region that vertically separates an upper portion of said initial fin structure from said semiconducting substrate;
performing a recess etching process to remove a portion of said upper portion of said initial fin structure so as to define a recessed fin portion;
forming a replacement fin on said recessed fin portion so as to define a final fin structure comprised of said replacement fin and said recessed fin portion; and
forming a gate structure around at least a portion of said replacement fin.

2. The method of claim 1, wherein oxidizing said lower portion of said initial fin structure comprises:
forming a layer of insulating material so as to over-fill trenches adjacent said initial fin structure such that an upper surface of said layer of insulating material is positioned above an upper surface of said initial fin structure; and
with said layer of insulating material overfilling said trenches, performing a thermal anneal process at a temperature that falls within the range of 400-1200° C.

3. The method of claim 2, wherein performing said thermal anneal process comprises performing said thermal anneal process in an oxidizing process ambient.

4. The method of claim 1, wherein said replacement fin is comprised of substantially pure germanium or silicon-germanium $(Si_{(1-x)}Ge_{(x)})$, where "x" may range from 0-1.

5. A method of forming a FinFET device, comprising:
forming an initial fin structure in a semiconducting substrate, wherein said initial fin structure is comprised of the substrate material;
oxidizing a lower portion of said initial fin structure to thereby define an isolation region that vertically separates an upper portion of said initial fin structure from said semiconducting substrate;
performing a recess etching process to remove a portion of said upper portion of said initial fin structure positioned between sacrificial sidewall spacers formed adjacent said upper portion of said initial fin structure so as to define a recessed fin portion and to define a replacement gate cavity between said sacrificial sidewall spacers above said recessed fin portion;
forming a replacement fin in said replacement fin cavity above said recessed fin portion so as to define a final fin structure comprised of said replacement fin and said recessed fin portion;
removing said sacrificial sidewall spacers; and
forming a gate structure around at least a portion of said replacement fin.

6. The method of claim 5, wherein oxidizing said lower portion of said initial fin structure comprises:
forming a layer of insulating material so as to over-fill trenches adjacent said initial fin structure such that an upper surface of said layer of insulating material is positioned above an upper surface of said initial fin structure; and
with said layer of insulating material overfilling said trenches, performing a thermal anneal process at a temperature that falls within the range of 400-1200° C.

7. The method of claim 6, wherein performing said thermal anneal process comprises performing said thermal anneal process in an oxidizing process ambient.

8. The method of claim 6, wherein said replacement fin is comprised of substantially pure germanium or silicon-germanium $(Si_{(1-x)}Ge_{(x)})$, where "x" may range from 0-1.

9. The method of claim 5, wherein, prior to removing said sacrificial sidewall spacers, the method further comprises performing a recess etching process to recess a surface of a layer of insulating material so as to expose said sacrificial sidewall spacers.

10. A method of forming a FinFET device, comprising:
performing at least one first etching process so as to form a plurality of initial trenches that extend into a semiconducting substrate to an initial depth so as to thereby define an initial fin structure comprised of the substrate material, said initial fin structure comprising sidewalls;
forming sacrificial sidewall spacers adjacent said sidewalls of said initial fin structure;
after forming said sacrificial sidewall spacers, performing a second etching process to extend said initial depth of said initial trenches into said substrate and thereby form a plurality of final trenches having a final depth that is greater than said initial depth and to define an elongated fin structure having an exposed portion that is not covered by said sacrificial sidewall spacers;
forming a layer of insulating material so as to over-fill said final trenches;
with said layer of insulating material over-filling said final trenches, performing a thermal anneal process to convert at least a portion of said exposed portion of said elongated fin structure into an isolation material that extends laterally under an entire width of an upper portion of said elongated fin structure;
performing at least one process operation to expose an upper surface of said upper portion of said elongated fin structure;
performing a recess etching process to remove a portion of said upper portion of said elongated fin structure positioned between said sacrificial sidewall spacers so as to define a recessed fin portion and to define a replacement gate cavity between said sacrificial sidewall spacers above said recessed fin portion;
forming a replacement fin in said replacement fin cavity above said recessed fin portion so as to define a final fin structure comprised of said replacement fin and said recessed fin portion;
recessing said layer of insulating material so as to expose said sacrificial sidewall spacers;
removing said sacrificial sidewall spacers; and
forming a gate structure around at least a portion of said replacement fin.

11. The method of claim 10, wherein forming said layer of insulating material so as to over-fill said final trenches comprises forming a layer of silicon dioxide so as to overfill said final trenches such that an upper surface of said layer of insulating material is positioned above an upper surface of said elongated fin structure.

12. The method of claim 10, wherein performing said thermal anneal process comprises performing said thermal anneal process at a temperature that falls within the range of 400-1200° C.

13. The method of claim 12, wherein performing said thermal anneal process comprises performing said thermal anneal process in an oxidizing process ambient.

14. The method of claim 10, wherein said replacement fin is comprised of substantially pure germanium or silicon-germanium ($Si_xGe_{1-x}$), where "x" may range from 0-1.

* * * * *